(12) United States Patent
Terakawa

(10) Patent No.: US 9,171,661 B2
(45) Date of Patent: Oct. 27, 2015

(54) NOISE REDUCER

(76) Inventor: Takashige Terakawa, Kanagawa (JP)

( * ) Notice: Subject to any disclaimer, the term of this patent is extended or adjusted under 35 U.S.C. 154(b) by 335 days.

(21) Appl. No.: 13/642,028

(22) PCT Filed: Apr. 26, 2011

(86) PCT No.: PCT/JP2011/060183
§ 371 (c)(1),
(2), (4) Date: Oct. 18, 2012

(87) PCT Pub. No.: WO2011/136232
PCT Pub. Date: Nov. 3, 2011

(65) Prior Publication Data
US 2013/0069741 A1 Mar. 21, 2013

(30) Foreign Application Priority Data

Apr. 26, 2010 (JP) .................................. 2010-101508

(51) Int. Cl.
H01F 17/06 (2006.01)
H03H 7/42 (2006.01)
H03H 1/00 (2006.01)

(52) U.S. Cl.
CPC .............. *H01F 17/06* (2013.01); *H03H 7/427* (2013.01); *H01F 2017/065* (2013.01); *H03H 1/0007* (2013.01); *H03H 2001/0035* (2013.01)

(58) Field of Classification Search
CPC ... H01F 17/06; H01F 17/04; H01F 2017/065; H03H 7/427; H03H 1/0007; H03H 2001/0035
USPC .................................................... 333/12, 181
See application file for complete search history.

(56) References Cited

FOREIGN PATENT DOCUMENTS

| JP | 41-009384 | | 5/1966 |
| JP | 089808/1990 | | 7/1990 |
| JP | 03-062607 | | 3/1991 |
| JP | 06-112048 | | 4/1994 |
| JP | 06-233521 | | 8/1994 |
| JP | 11-008123 | | 1/1999 |
| JP | 2001-313216 | | 11/2001 |
| JP | 2002-198764 | | 7/2002 |
| JP | 2002-204137 | | 7/2002 |
| JP | 2006-033113 | | 2/2006 |
| JP | 2006033113 A | * | 2/2006 |

OTHER PUBLICATIONS

International Search Report, mailed Aug. 2, 2011, for corresponding International Application No. PCT/JP2011/060183.

* cited by examiner

*Primary Examiner* — Benny Lee
*Assistant Examiner* — Albens Dieujuste
(74) *Attorney, Agent, or Firm* — Greenblum & Bernstein, P.L.C.

(57) ABSTRACT

A noise reducer is provided that ameliorates electromagnetic noise interference. More specifically, the noise reducer ameliorates electromagnetic noise interference for electronic equipment caused by noise superimposed on a conductor wire. The conductor wire includes a magnetic cylindrical core that penetrates a hollow hole, a winding coiled around the magnetic cylindrical core, and an impedance element connected to the winding. When a noise current is superimposed on the conductor wire that has been made to penetrate the magnetic cylindrical core, part of the noise current is electromagnetically induced from the conductor wire to the winding and flows to the winding. The noise current that flows to the winding is transformed into heat and consumed by the impedance element. As a result, the noise power that gives electromagnetic noise interference to the electronic devices can be reduced and the electromagnetic noise interference for the electronic devices ameliorated.

5 Claims, 13 Drawing Sheets

FIG. 9

| TURNED ANGLE θ (DEGREES) | 0 | 10 | 30 | 60 | 90 |
|---|---|---|---|---|---|
| L [mH] | 1.7 | 5.3 | 9.0 | 11.7 | 17.2 |

NOISE REDUCER

TECHNICAL FIELD

The present invention relates to a noise reducer which decreases electromagnetic interference caused due to noise (hereinafter, referred to as "electromagnetic noise interference") that affects medical equipment, computer-controlled electronic precision devices, and the like.

BACKGROUND ART

Recently, malfunctions of medical equipment, computer-controlled electronic precision devices, and the like as well as unintentional sudden accelerations and the like by drives of electric automobiles and hybrid automobiles have been considered as problems. Those problems are considered to be based on the existence of electromagnetic noises in the environment where the medical equipment, computer-controlled electronic precision devices, and the like are placed or in the environment where electric automobiles and hybrid automobiles are travelling.

In the meantime, noise failure is not necessarily generated in the places where the medical equipment, computer-controlled electronic precision devices, and the like are placed, even though there is a large electromagnetic field of the electromagnetic noise. It is because there is such state where noise failure is not generated in the medical equipment, computer-controlled electronic precision devices, and the like, even though there is a large electromagnetic field of the electromagnetic noise by an inverter power supply and the like that are actually closely placed under the environment where the medical equipment, computer-controlled electronic precision devices, and the like are placed. Therefore, it is considered that the noise failure is generated due to multiple factors such as the frequency and the size of the noise current flown in wiring conductors in the periphery of the electronic device, a wiring configuration of the medical equipment, computer-controlled electronic precision devices, and the like.

Currently, the problems of the noise failure generated due to the electromagnetic waves are the important interference issue to be dealt with for the medical equipment, computer-controlled electronic precision devices, and the like. Thus, various types of noise countermeasure products are developed and put on the market. However, the selection and method of use various types of noise countermeasure products and generation of the noise failure reduction effects thereof actually depend on the technical discretion of those in charge of the technology in the manufactures of the medical equipment, computer-controlled electronic precision devices that use the noise countermeasure products.

Next, modes of the electromagnetic noise current will be described.

The modes of the electromagnetic noise current inducing noise failure are generally classified into a normal mode (or a differential mode current) and a common mode current (or an unbalanced current). A phenomenon where the common mode noise current and the normal mode noise current are both superimposed on a formal signal current of a signal transmission conductor wire connected to an electronic device is well known.

Therefore, the currently-used filters are structured to deal with the noise current of both the normal and common modes. In general, the electromagnetic noise interference in the medical equipment and the computer-controlled electronic precision devices is considered to be generated mainly via a power supply line and an earth lines connected to a power lines, so that power-supply line noise filters are put on the market and used frequently. Further, while there is no normal mode noise current with a single-line earth line, it is not allowed to insert, into a line, a noise countermeasure product that obstructs the safe function that is the original function of the earth line for use. Thus, the countermeasure product thereof is limited in terms of its function.

In the meantime, the basic form of the power-supply line noise filters currently on the market is in the structure shown in FIG. 10. For a ferrite toroidal core 20 used for an inductor coil used in a broadband characteristic ferrite material that exhibits a large magnetic permeability value in the high-frequency region and an excellent low-loss characteristic. However, even though the ferrite material is a magnetic material that exhibits the excellent broadband characteristic, it is easily magnetic-saturated even with a small current value when used as an inductor. Thus, two coils 21, 22 are coiled around a single ferrite toroidal core 20 in many of the power-supply line noise filters on the market (e.g., Japanese Unexamined Patent Publication Hei 6-233521). They are coiled to mutually cancel magnetic flux $\phi$ within the ferrite toroidal core 20 as shown in FIG. 11 so that the ferrite toroidal core 20 does not lose the inductor function by being magnetically saturated with the normal mode power supply current of several to several tens of amperes flown in the power supply line. Thus, the two coils 21, 22 exhibit no inductor function for the normal-mode noise current and have no obstructing function thereof. However, for the common-mode noise current considered as a minute current that is so small that induces no magnetic saturation in the ferrite toroidal core 20 even when superimposed on the power supply line, the coils 21, 22 both function as the inductor since the directions of the magnetic flux $\phi$ become the same directions. That is, the two coils 21, 22 coiled around the ferrite toroidal core 20 are coils that are subjected to function to obstruct the common-mode noise current, and those are designed not to be magnetically saturated by the power supply current. In general, the coiled numbers of the coils 21, 22 are designed to be the same, and actually designed to obstruct the magnetic saturation regardless of the extent of the normal-mode power supply current value.

Patent Document 1: Japanese Unexamined Patent Publication Hei 6-233521

As described above, the inductor coil of the noise filter used for the conductor wire of the power supply line, for example, only has a function of preventing the common-mode noise current from flowing into the electronic device side but has no function of preventing the normal-mode noise current from flowing in. In the currently-used power-supply line noise filter of the basic structure shown in FIG. 10, the function of preventing the noise current of both of the normal and common modes from flowing into the electronic device side is designed to create a short-circuit state mainly by a capacitor C so that the noise frequency current does not flow into the electronic device side.

Next, a well-known and wide-spread noise countermeasure product using a ferrite material shown in FIG. 12 will be described. Noise countermeasure products of this type are put on the market from many ferrite material manufactures (TDK Corporation, NEC TOKIN Corporation, and the like). The noise countermeasure product is considered to exhibit a noise current reduction effect by inserting a conductor wire into an insertion hole 23a of a cylindrical ferrite core 23. Further, the noise countermeasure product shown in FIG. 13 is a developed type of the cylindrical ferrite noise countermeasure product shown in FIG. 12, and it is used by providing a plurality of insertion holes 24a in a plate-type ferrite core 24 in parallel and inserting a plurality of conductor wires thereto.

Regarding the noise countermeasure products using the ferrite shown in FIG. 12 and FIG. 13, it is assumed that the ferrite materials are so blended and sintering-processed that the loss of the magnetic substance is small in a low-frequency region that is a frequency region of a normal signal current flown in the conductor wire and that the loss of the magnetic substance is large in a high-frequency noise region that exceeds a signal frequency region. However, it is considered an extremely difficult task to adjust the noise current obstruction frequency region by blending the materials and executing a sintering work.

Further, a small current value is assumed as the signal current of the noise countermeasure products. Thus, those are employed for only the conductor wires that are not necessary to take the magnetic saturation of the ferrite material due to the current of the inserted conductor wire into consideration.

An object of the present invention is to provide a noise reducer which reduces the noise failure generated in the medical equipment and the computer-controlled electronic precision devices through consuming a part of the noise current superimposed on the conductor wires such as the power supply line and the earth line with the resistance provided on a winding-side circuit and suppressing the noise current superimposed on the conductor wires by electromagnetic induction between the conductor wires and the windings.

SUMMARY OF THE INVENTION

That is, as shown in FIGS. 1A and 1B, the noise reducer according to the present invention is characterized to: use a ferrite material that exhibits a small loss even in a high-frequency region for a cylindrical core 2; to coil a winding 3 penetrated through a hollow part of the cylindrical core 2; and to provide an impedance element 4 to the winding 3. It is designed to consume the noise current superimposed on a conductor wire 1 by the impedance element 4 by inducing it to the winding 3 by the electromagnetic induction effect for the winding 3 and to reduce the nose interference by inserting the conductor wire 1 inside the hollow part 2a of the cylindrical core 2 to which the winding is provided. As the cylindrical core used in the noise reducer according to the present invention, a cylindrical shape may be formed by superimposing a plurality of existing broadband-characteristic toroidal cores or a sintering-processed core formed in a cylindrical shape in the first place may be used as well. It is also possible to use other magnetic materials instead of the ferrite material.

The present invention makes it possible to reduce the noise failure by inserting the conductor wire such as the earth line or the power-supply line into the cylindrical core of the noise reducer, and to contribute to purify the electromagnetic environment by suppressing reemission of the noise power to minimum.

Further, even when the conductor wire is a single earth line or two or three lines of power supply lines, each of the individual conductor wires can be inserted and used individually. Thus, it can be utilized effectively for reducing the electromagnetic wave noise failure generated in the earth line and the multiple power-supply lines.

Furthermore, it becomes unnecessary to perform a wiring connection work of the conductor wires by simply inserting and placing the conductor wires into the cylindrical core, so that there is also an advantage of being able to take a noise failure countermeasure while maintaining the current wiring relation.

While the impedance element connected to the wiring is illustrated with a pure resistance in FIGS. 1A and 1B, the impedance element may be such type having a frequency response characteristic including a capacitor and an inductor. However, in order to clarify the explanation of the noise electromagnetic wave environment purifying function of the present invention, the explanation will be provided in the embodiment of the present invention in the followings by referring to the case of using only the pure resistance shown in FIGS. 1A and 1B.

BRIEF DESCRIPTION OF THE DRAWINGS

FIG. 4A shows explanation charts showing a method for enhancing the electromagnetic noise interference reduction effect by using a plurality of the noise reducers according to the embodiment of the present invention, in which FIG. 4A is a case where a plurality of the noise reducers according to the present invention are inserted through a single line such as an earth line, for example.

FIG. 9 is a chart showing changes of the inductance value with respect to the changes of the angle θ between two air gaps when positions of the air gaps of the neighboring cores shown in FIG. 8 are shifted to the circumferential direction;

BEST MODES FOR CARRYING OUT THE INVENTION

A harness (conductor wire) for connecting between computer-controlled electronic devices is mounted inside an engine room of an automobile, for example, and the entire length of the harness may often reach ten-something meters. An ignition noise electromagnetic wave is a high frequency of several tens of kilohertz to several megahertz, and the conductor wire of the harness is considered to work as a linear reception antenna. That is, it is a well-known fact in the field of the antenna engineering that any kinds of conductor wires all work as linear antennas, and the harness (conductive wire) is not an exception.

Therefore, the ignition noise electromagnetic wave intruded inside the engine room including a road face reflection and the like can be a factor for generating a common-mode noise current to the conductor wire of the harness, since the conductor wire of the harness works as the linear reception antenna.

Based on that, it is considered that the noise current generated on the conductor wire of the harness induces the electromagnetic noise interference in the electronic control circuit and to cause a problem of sudden speed increase unintended by the driver, etc.

The present invention is the invention designed in view of the above-described conditions, which contributes to reducing the noise failure accidents achieved by the theoretical investigations of the technical countermeasure for the electromagnetic noise.

Figure 1A:
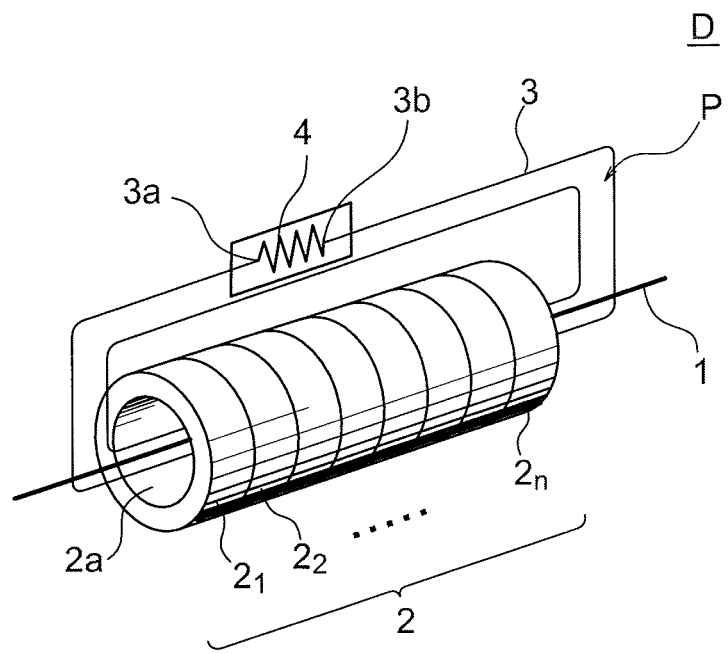
FIG. 1A is a perspective view showing a noise reducer according to an embodiment of the present invention.
Figure 1B:
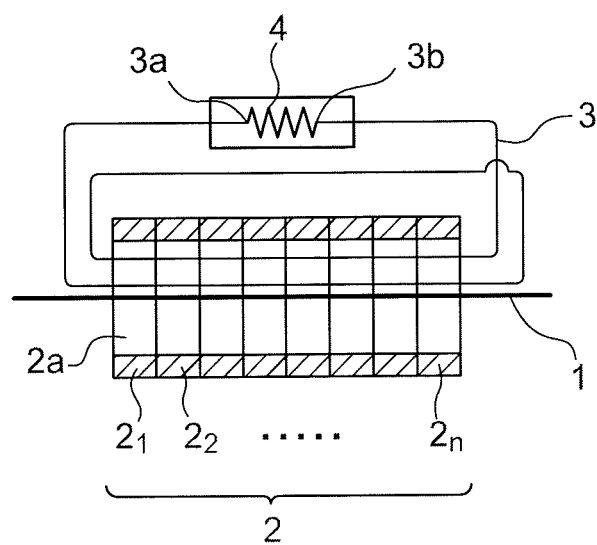
FIG. 1B shows a sectional view of a cylindrical core used in the noise reducer according to the embodiment of the present invention.

As shown in FIGS. 1A and 1B, the basic structure of the noise reducer according to the embodiment of the present invention includes: a cylindrical magnetic core (referred to as a cylindrical core hereinafter) 2 into which a conductor wire 1 such as a power line or an earth line where a noise is superimposed is penetrated through a hollow hole 2a; a winding 3 coiled around the cylindrical core 2 via the hollow hole 2a of the cylindrical core 2; and an impedance element 4 connected to the winding 3. In this case, the conductor wire 1 and the winding 3 are electrically insulated. While the impedance element 4 connected to the winding 3 constituting a secondary-side winding circuit P is illustrated with a pure resistance 4 in FIGS. 1A and 1B, the impedance element 4 may be such type having a frequency responsive characteristic including a capacitor and an inductor other than the resistance. However, in order to clarify the explanation of the noise electromagnetic wave environment purifying function of the present invention, the explanation will be provided in the embodiments of the present invention in the followings by referring to the case of using only the pure resistance shown in FIGS. 1A and 1B.

Specifically, as shown in FIGS. 1A and 1B, in the embodiment, the cylindrical core 2 is formed by stacking a plurality of magnetic ring cores (e.g., ferrite toroidal cores) $2_1$, $2_2$, - - - , $2_n$ having the so-called broadband characteristic whose magnetic loss is small over the ranges from the low frequency to the high frequency.

Figure 12:
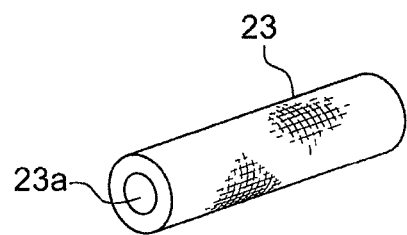
FIG. 12 is a perspective view showing a widely-used bead-type ferrite noise countermeasure product on the market.

When there is a magnetic saturation phenomenon generated in the cylindrical core 2, the winding 3 does not function as the inductor. Thus, the noise current obstruction effect and the noise power consumption effect by the resistance 4 cannot be expected. Therefore, employed is a form with which the conductor wire 1 such as the power line is simply inserted into the hollow hole 2a of the cylindrical core 2 and used in order to suppress the magnetic saturation of the cylindrical core 2 to minimum, so that the magnetic flux generated within the cylindrical core 2 by the signal line current such as the power supply current becomes minimum to deal with the magnetic saturation of the cylindrical core 2 as in the case of the ferrite bead shown in FIG. 12. The current noise countermeasure product of FIG. 12 currently put on the market is also in a form which is used by inserting the conductor wire. However, even though the ferrite core is formed to exhibit a large magnetic loss in the high-frequency region, the noise suppression effect in the noise frequency region of less than MHz is small.

In the meantime, the embodiment shown in FIG. 1 and FIG. 2 according to the present invention presents the form in which the cylindrical core 2 is formed by superimposing eight toroidal cores (magnetic ring cores) $2_1$, $2_2$, - - - , $2_n$ having the broadband low-loss characteristic. In this case, the inductance value for the conductor wire 1 to be inserted becomes small when the number of the toroidal cores $2_1$, $2_2$, - - - , $2_n$ to be superimposed is small, while it becomes large when the number is large. Thus, the noise current suppression value and the effective low-limit frequency can be controlled by changing the number of the toroidal cores $2_1$, $2_2$, - - - , $2_n$ that form the cylindrical core 2, the value of the resistance 4, and the coiled number N of the winding 3. It is to be noted that the number of the toroidal cores (magnetic ring cores) $2_1$, $2_2$, - - - , $2_n$ is not limited only to "8". While the ferrite toroidal cores are used as the plurality of (magnetic ring cores) $2_1$, $2_2$, - - - , $2_n$, it is also possible to use other magnetic ring cores such as silicon steel, iron, and permalloy.

While the cylindrical core is created in the form where a plurality of ferrite toroidal cores are superimposed in the embodiments shown in FIG. 1A and FIG. 1B, it is also possible to use a unified-type sintering-processed cylindrical core or a cylindrical core formed by combining half-divided shapes of such type.

Further, as shown in FIG. 1B, the winding 3 of the secondary-side winding circuit P of FIG. 1A is coiled N-times through the hollow hole 2a of the cylindrical core 2, and the resistance 4 is connected between terminals 3a and 3b thereof. Further, the winding 3 is coiled around the cylindrical core 2 in such a manner that there is no electric contact made with the inserted conductor wire 1. It is also possible to use an inductor and a capacitor in the winding circuit P in addition to the resistance 4 to give a frequency characteristic to the noise power of heat consumption. In that case, the elements which thermally consume the noise current that is electromagnetically induced by the winding 3 by being connected to the winding 3 of the winding circuit P including the winding circuit using only the resistance 4 and the circuit using the resistance, the inductor, and the capacitor are referred to as the impedance element 4. Regarding the basic structure of the present invention, details of the relation between inductance $L_0$ given to the conductor wire 1 by the cylindrical core 2 and inductance $L_1$ depending on the coiled number N of the winding 3 as well as the noise failure reduction function will be described later.

With the above-described structure, the noise reducer according to the embodiment of the present invention is configured in such a manner that, when the noise current is superimposed on the conductor wire 1 such as the power line or the earth line penetrated through the hollow hole 2a of the cylindrical core 2, a part of the noise current is electromagnetically induced to the winding 3 from the conductor wire 1 to flow into the winding 3 and thermally consumed in the resistance 4 that is provided to the winding 3, the noise power flown to the medical equipment and computer-controlled electronic precision devices in which the electromagnetic noise interference is generated is reduced, and the electromagnetic noise interference is eliminated.

As described above, even in a case where the conductor wire 1 is inserted into the hollow hole 2a of the cylindrical core 2 to be used in the noise reducer according to the present invention, the number of used magnetic ring cores for forming the cylindrical core 2, the coiled number of the winding 3, and the resistance value of the resistance 4 on the winding 3 side may be determined as appropriate according to the state of the noise failure and the electromagnetic environment where the electronic device exposed to the interference is placed.

Next, the noise failure reduction function of the noise reducer according to the present invention will be described by using a circuit structure model shown in FIG. 2A.

Figure 2A:
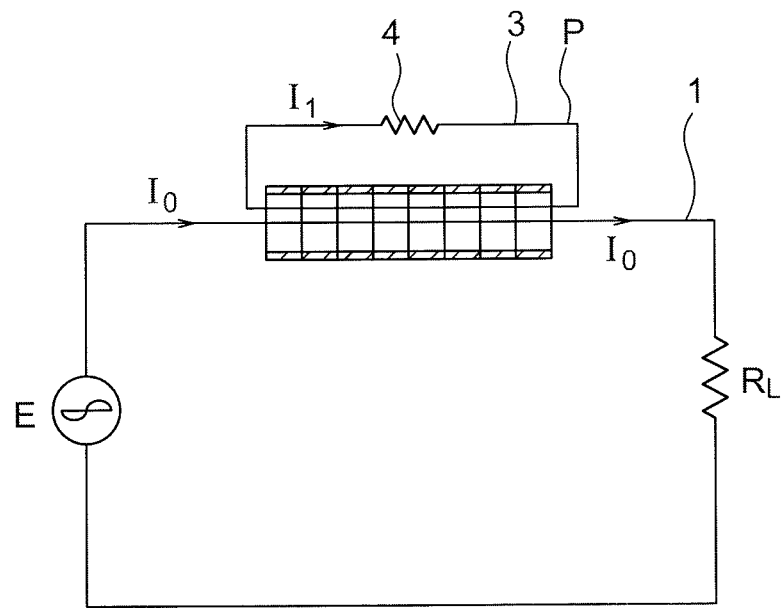
FIG. 2A is a circuit diagram for describing the state when reducing the noise failure by inserting the conductor wire into the noise reducer according to the present invention.

In FIG. 2A, a noise current $I_0$ flown by superimposing on the signal current of the conductor wire 1 such as the power-supply line is a common-mode current flown as a result when the conductor wire 1 functions as a linear antenna, and the reception voltage of the linear antenna is shown as a noise voltage source E. Further, while the noise current $I_0$ shows the form of the normal-mode current in FIG. 2A, the common-mode noise current can also be described by the same circuit model by assuming an equivalent noise load resistance $R_L$ to be described later. That is, regardless whether the noise current is the common-mode or the normal-mode, it is considered to necessarily consume the noise power when the noise failure is generated in the medical equipment and the computer-controlled precision device and considered to be able to define $R_L$ as an equivalent noise load resistance provided that the power consumption amount is $I_0^2 R_L$. Therefore, even in the case of the common-mode noise current, the noise failure may simply be dealt by the model shown in FIG. 2A by considering that it is the current by the interposition of a stray capacitance formed between the casing of the device and the ground.

As described above, the embodiment of the present invention creates the noise failure reduction effect for the device by thermally consuming a part of the noise current $I_0$ superimposed on the conductor wire 1 in the resistance 4 by inducing it to the winding 3 with an electromagnetic induction effect and by reducing the consumption noise power $I_0^2 R_L$ in the equivalent noise load resistance $R_L$.

The inventors of the present invention measured the relation between the inductance $L_0$ given by the conductor wire 1 inserted into the hollow hole 2a of the cylindrical core 2 and the inductance $L_1$ given by the winding 3 by L, C, R meters and have found that there is a following relation (1) with respect to the coiled number N of the winding 3 provided that the inductance given by the conductor wire 1 inserted into the hollow hole 2a of the cylindrical core 2 is $L_0$ and the inductance given by the winding 3 is $L_1$.

$$L_1 \approx N^2 L_0 \quad (1)$$

Next, the effect of reducing the noise current $I_0$ will be discussed based on the relation of (1) described above.

In FIG. 2A, the noise power $P_{RL}$ consumed in the equivalent noise load resistance $R_L$ are acquired. The noise power $P_{RL}$ is the power that gives a noise failure to the electronic device according to the noise current $I_0$. In other words, it is the power consumed for the noise failure. The noise power $P_{RL}$ is acquired in a form of Expression (8) from Expressions (4) and (5) solved by simultaneous differential equations shown in Expressions (2) and (3) assuming that the noise source voltage is $e = Ee^{j\omega t}$, the noise current $I_0$ is $i_0 = I_0 e^{j\omega t}$, and the noise current flown by being electromagnetically induced to the wiring 3 is a sine wave of $i_1 = I_1 e^{j\omega t}$. Note here that $I_0$ is the noise current superimposed in the conductor wire 1, and $I_1$ is the noise current flown by electromagnetically induced to the winding 3. $L_0$ is the inductance given by the conductor wire 1 inserted to the cylindrical core 2 as described above, $L_1$ is the inductance given by the winding 3, $R_L$ is the resistance value of the equivalent noise load, and $R_1$ is the resistance value of the resistance 4 connected to the winding 3.

The solutions of simultaneous differential equations of Expression (2) and (3) are shown in Expressions (4) and (5).

$$L_0 \frac{di_0}{dt} + R_L i_0 + M \frac{di_1}{dt} = e \quad (2)$$

$$L_1 \frac{di_1}{dt} + R_1 i_1 + M \frac{di_0}{dt} = 0 \quad (3)$$

$$(R_L + j\omega L_0)I_0 + j\omega M I_1 = E \quad (4)$$

$$(R_1 + j\omega L_1)I_1 + j\omega M I_0 = 0 \quad (5)$$

Assuming that $M = \sqrt{L_0 L_1}$ (where $M \geq 0$ in this case), Expressions (8) and (9) can be acquired from the relation of $L_1 \approx N^2 L_0$ in Expression (1) and Expressions (6) and (7).

$$I_0 = \frac{R_1 + j\omega L_1}{R_1 R_L + j\omega(R_1 L_0 + R_L L_1)} E \quad (6)$$

$$I_1 = \frac{-j\omega \sqrt{L_0 L_1}}{R_1 R_L + j\omega(R_1 L_0 + R_L L_1)} E \quad (7)$$

$$P_{RL} = |I_0|^2 R_L = \frac{1 + N^4 \left(\frac{\omega L_0}{R_1}\right)^2}{1 + \left(\frac{\omega L_0}{R_1}\right)^2 \left(N^2 + \frac{R_1}{R_L}\right)^2} \frac{E^2}{R_L} \quad (8)$$

$$P_{R1} = |I_1|^2 R_1 = \frac{N^4 \left(\frac{\omega L_0}{R_1}\right)^2 \left(\frac{R_1}{R_L}\right)}{1 + \left(\frac{\omega L_0}{R_1}\right)^2 \left(N^2 + \frac{R_1}{R_L}\right)^2} \frac{E^2}{R_L} \quad (9)$$

$P_{RL}$ is the noise power consumed in the equivalent noise load resistance $R_L$, and $P_{R1}$ is the noise power consumed in the resistance 4 of the winding 3. In Expressions (8) and (9), a) is an angular frequency of the noise voltage and current.

The noise power consumed in the equivalent noise load resistance $R_L$ when the noise reducer according to the embodiment of the present invention is not used is $E^2/R_L$.

In the meantime, when the noise reducer according to the embodiment of the present invention is used, a part of the noise power is reradiated and a part of the noise current $I_0$ is thermally consumed in the resistance 4 of the winding 3 by being electromagnetically induced to the winding 3. When Expression (10) is substituted in Expression (8), a shown in Expression (10) evidently becomes smaller than 1, so that it is shown that it becomes smaller than $E^2/R_L$ of the noise power consumed in the equivalent noise load resistance $R_L$ when the noise reducer according to the embodiment of the present invention is not used, thereby exhibiting the function of reducing the noise failure. Further, it is shown that a part of the noise power is consumed as the power $P_{R1}$ shown in Expression (9) by the resistance 4 on the winding 3 side.

$$\alpha = \frac{1 + N^4 \left(\frac{\omega L_0}{R_1}\right)^2}{1 + \left(\frac{\omega L_0}{R_1}\right)^2 \left(N^2 + \frac{R_1}{R_L}\right)^2} \quad (10)$$

As described above, by using the noise reducer according to the present invention, the noise failure elimination effect can be expected by reducing the power $P_{RL}$ consumed for generating the noise failure by the equivalent noise load resistance $R_L$.

Further, when Expression (11) is substituted in Expression (9) which shows the noise power $P_{R1}$ consumed in the resistance 4 of the winding 3 of the noise reducer, various kinds of $\alpha$ and $\beta$ can be acquired by selecting the values of N and $R_1$ of Expressions (10) and (11).

$$\beta = \frac{N^4 \left(\frac{R_1}{R_L}\right)\left(\frac{\omega L_0}{R_1}\right)^2}{1 + \left(\frac{\omega L_0}{R_1}\right)^2 \left(N^2 + \frac{R_1}{R_L}\right)^2} \quad (11)$$

Therefore, it becomes possible to perform a noise failure elimination work while reducing the environmental electromagnetic noise in the noise countermeasure site. Thus, numerical value examples regarding the values of $\alpha$ and $\beta$ when performing such work will be discussed.

The actually measured value 64 µH acquired by an impedance meter is used for $L_0$ of Expression (1) of the cylindrical core 2 shown in FIG. 1. Regarding the values of $\alpha$ and $\beta$ by Expression (10) and (11) using this value, the value of a becomes $\alpha=-3.2$ dB at the noise frequency of 100 KHz. $\alpha=-9$ dB at the noise frequency of 500 KHz, $\alpha=-10$ dB at the noise frequency of 2 MHz. and also $\alpha=-10$ dB at the noise frequency of 10 MHz or more. provided that the coiled number of the winding 3 is N=3, the resistance value of the resistance 4 is $R_1=1$ kΩ, the resistance value of the equivalent noise load resistance is $R_L=50Ω$. Further, regarding $\beta$, the value of $\beta$ becomes $\beta=0.12$ at the noise frequency of 100 kHz, $\beta=0.21$ at the noise frequency of 500 kHz, and also $\beta=0.21$ at the noise frequency of 1 MHz or more.

That is, regarding the noise frequency power $E^2/R_L$ in this case at 500 kHz or more, it is shown that 21% thereof is thermally consumed in the resistance 4, the interference power in the equivalent noise load resistance $R_L$ is lightened to 10 to 12%, and the remaining noise frequency power becomes the reflection power.

In the meantime, when the resistance value $R_1$ of the resistance 4 of the winding 3 is changed to 5 KΩ under the same condition of $L_0=64$ µH, N=3, and $R_L=50Ω$, the value of $\alpha$ becomes $\alpha=-2.3$ dB at the noise frequency of 100 KHz, $\alpha=-12$ dB at the noise frequency of 500 KHz, and $\alpha=-20$ dB at the noise frequency of 2 MHz or more. Thus, the consumption noise power of the equivalent noise load resistance $R_L$ becomes reduced at the noise frequency of 500 KHz or more compared to the case of $R_1=1$ kΩ, and the noise failure reduction effect is improved.

In the meantime, the value of $\beta$ becomes $\beta=0.03$ at the noise frequency of 100 kHz, $\beta=0.07$ at the noise frequency of 500 kHz, and $\beta=0.08$ at the noise frequency of 2 MHz or more. Thus, the thermally consumed power in the resistance 4 of the winding 3 is reduced greatly. Therefore, the reflection power is also increased greatly, so that the effect contributing to ease the electromagnetic environment regarding the noise electromagnetic wave is decreased.

As described above, various kinds of $\alpha$ and $\beta$ can be acquired by selecting the coiled number N of the winding 3 and the resistance value $R_1$ of the resistance 4 under such condition from the relation shown in Expression (1) described above regarding the inductance $L_0$ given by the conductor wire 1 inserted to the cylindrical core 2, the inductance $L_1$ given by the winding 3, and the coiled number N of the winding 3. Through selecting the values of $\alpha$ and $\beta$ as appropriate, it is possible to purify the electromagnetic environment and to reduce the noise failure.

It is not considered to have a large environmental noise electromagnetic field under the current legal noise restriction such as CE marking. Thus, it is assumed that the equivalent noise load resistance $R_L$ is small when the noise current $I_0$ flown in the conductor wire 1 is large, and that the equivalent noise load resistance $R_L$ is large when the noise current $I_0$ flown in the conductor wire 1 is small. Therefore, in this embodiment, it is estimated that the equivalent noise load resistance $R_L$ is about 50Ω at the most.

Further, when the resistance value of the equivalent noise load resistance $R_L$ is changed while the coiled number N of the winding 3 is fixed as shown in Expressions (8) to (11), the value of the resistance value $R_1$ of the resistance 4 connected to the winding 3 may be changed as appropriate to deal with the noise failure or the optimum $R_L$ value for overcoming the noise failure may be selected by changing the coiled number N of the winding 3. That is, with the electronic device under the electromagnetic noise interference, it is possible to select the optimum values of N and $R_1$ with which the noise failure can be reduced/eliminated and with which the electromagnetic environment at the site of placing the electronic device can be improved. Note, however, that the value of $R_L$ is considered as an intrinsic value of the electronic device that is under the noise failure, which is not a value acquired by a measurement work and is a value estimated from a noise frequency current measurement value of the conductor wire 1 acquired by a clamp-type oscilloscope ammeter and an electromagnetic field measurement value of an environmental electromagnetic noise.

It is needless to say that it is also possible to deal with the electromagnetic noise interference by using a variable resistor and by making the value thereof variable instead of using the resistance 4 in the noise reducer according to the present invention.

Next, the noise reduction effect and the noise electromagnetic environment purifying function according to the present invention will be described by referring to FIG. 3.

Figure 3:
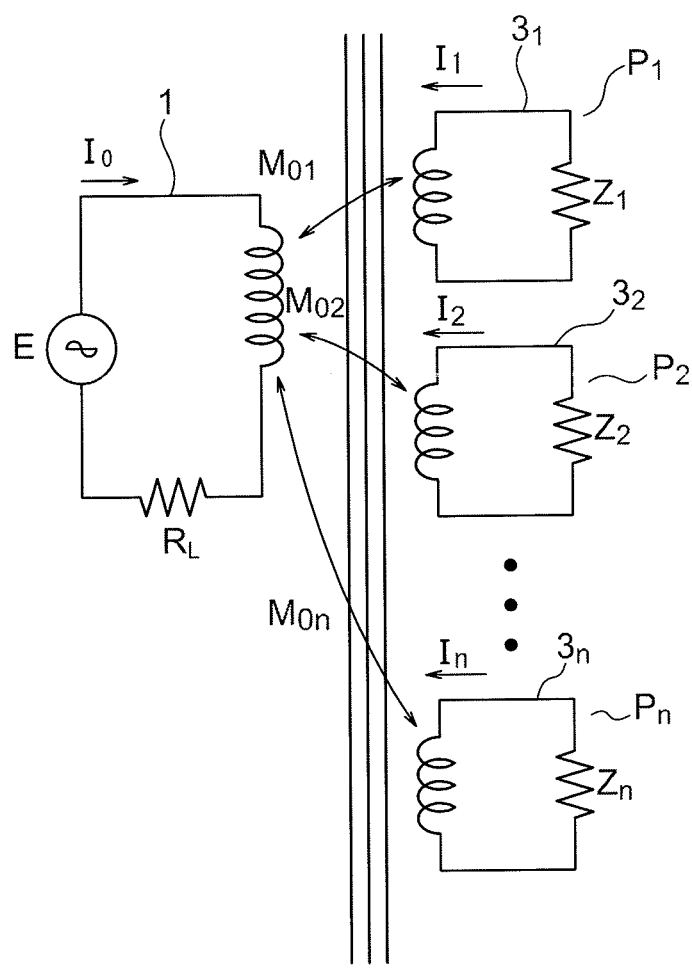
FIG. 3 is an equivalent circuit diagram showing a noise reducing function of the noise reducer according to the embodiment of the present invention.

FIG. 3 is an equivalent circuit diagram corresponding to a transformer in which the conductor wire 1 penetrating through the hollow hole 2a of the cylindrical core 2 formed by stacking the magnetic ring cores $2_1, 2_2, - - -, 2_n$ is a primary winding and windings $3_1, 3_2, - - -, 3_n$ coiled around the cylindrical core 2 by being inserted into the hollow hole 2a of the cylindrical core 2 are secondary windings.

Figure 2B:
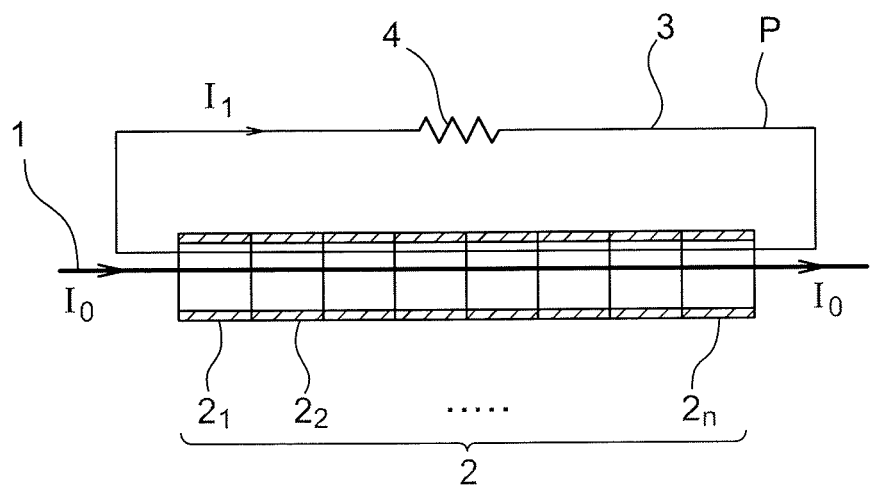
FIG. 2B is a block diagram used for an explanation by enlarging the noise reducer part of FIG. 2A, which is shown in a duplicated manner with FIG. 1B.

While there is one winding 3 shown as the secondary winding and the circuit element of the winding circuit P constituted with that winding 3 is shown as the pure resistance 4 in FIGS. 2A and 2B, it is also possible employ the structure shown in FIG. 3. That is, as shown in FIG. 3, there may be a plurality of windings $3_1, 3_2, - - -, 3_n$ coiled individually and separately around the cylindrical core 2. Further, it is also possible to set a plurality of individually separated winding circuits $P_1, P_2, - - -, P_n$ formed by the plurality of windings $3_1, 3_2, - - -, 3_n$. Furthermore, as the impedance element 4 connected to the windings $3_1, 3_2, - - -, 3_n$ of the plurality of secondary windings, not only a type constituted with a single pure resistance but also an impedance element 4 including a resistance as well as an inductor and a capacitor may be used as well.

Therefore, in FIG. 3, the impedance elements 4 are shown with $Z_1$ to $Z_n$ instead of the resistance 4 shown in FIG. 2. Further, in FIG. 3, E shows a voltage when the conductor wire 1 operates as an antenna and the noise current $I_0$ is derived. $I_1$, $I_2$ to $I_n$ show the noise currents derived by the mutual induction effect for $I_0$ and each of the windings $3_1$, $3_2$, - - - , $3_n$. Therefore, from FIG. 3, following equations can be acquired.

$$R_L I_0 + j\omega M_{10} I_1 + j\omega M_{20} I_2 + \ldots + j\omega M_{n0} I_n = E \quad (12)$$
$$j\omega M_{01} I_0 + Z_1 I_1 + j\omega M_{21} I_2 + \ldots + j\omega M_{n1} I_n = 0$$
$$\vdots$$
$$j\omega M_{0n} I_0 + j\omega M_{1n} I_1 + j\omega M_{2n} I_2 + \ldots + Z_n I_n = 0$$

In Expression (12) (determinant), $\omega$ is an angular frequency of the noise current, $M_{01}$ and the like are mutual induction coefficients between the primary-side winding (conductor wire 1) and each of the secondary-side windings $3_1$, $3_2$, - - - , $3_n$. However, only the mutual induction coefficients between the primary-side winding (conductor wire 1) and each of the secondary-side windings $3_1$, $3_2$, - - - , $3_n$ are shown in FIG. 3 in order to avoid the complication in the drawing. As is well known, $M_{mn} = M_{nm}$. Further, the coiled numbers $N_1$, $N_2$ and the like of the windings $3_1$, $3_2$, - - - $3_n$ show the number of the windings $3_1$, $3_2$, - - - , $3_n$ and the coiled numbers thereof, and subscript numbers of those and subscript numbers of the current I, the inductance L of the windings are set to coincide with each other. Further, the mutual induction coefficient $M_{nm}$ is defined as follows, where k=1.

$$M_{nm} = \pm k\sqrt{L_n L_m}$$

By solving Expression (12) while considering the above, $I_0$ to $I_n$ can be acquired. Therefore, the noise failure power $I_0^2 R_L$ and the noise power consumed in each of the impedance elements $Z_1$ to $Z_n$ of each of the secondary-side windings $3_1$, $3_2$, - - - , $3_n$ can be found.

The inventors of the present invention measured the relation between the inductance $L_0$ given by the conductor wire 1 inserted into the hollow hole 2a of the cylindrical core 2 and the inductance $L_m$ given by the windings 3 by L, C, R meters and have found that there is a following relation of Expression (13) between the inductance $L_0$ given by the conductor wire 1 inserted into the hollow hole 2a of the low-loss cylindrical core 2 and the inductance $L_m$ given by the windings 3 with the coiled number $N_m$ as in the case of Expression (1) described above.

$$L_m \approx N_m^2 L_0 \quad (13)$$

When calculating Expression (12) by using the relation of Expression (13), it is possible to let $L_m$ be equal to $N_m^2 L_0$. Thus, $M_{nm} = \pm N_n N_m L_0$ can be acquired.

Further, when the impedance elements $Z_1$, $Z_2$, - - - , $Z_n$ of FIG. 3 are simply set as the pure resistances $R_1$, $R_2$, - - - , $R_n$ by considering the consumption amount of the noise power, $Z_0$, $Z_1$, $Z_2$, - - - , $Z_n$ of Expression (12) become $Z_0 = R_L + j\omega L_0$, $Z_1 = R_1 + j\omega L_1 = R_1 + N_1^2 j\omega L_0$, - - - $Z_n = R_n + j\omega L_n = R_n + N_n^2 j\omega L_0$. Thus, the noise power consumption amount in the resistance $R_L$ and the resistances $R_1$, $R_2$, - - - , $R_n$ of the secondary-side windings $3_1$, $3_2$, - - - , $3_n$ can be found from each of the current values $I_0$, $I_1$, $I_2$, - - - , $I_n$ as follows.

In the case where the number of the secondary-side winding is n=1, followings can be acquired.

$$P_{RL} = |I_0|^2 R_L = \frac{1 + N_1^1 \left(\frac{\omega L_0}{R_1}\right)^2}{1 + \left(\frac{\omega L_0}{R_1}\right)^2 \left(N_1^2 + \frac{R_1}{R_L}\right)^2} \frac{E^2}{R_L} = \alpha_1 \frac{E^2}{R_L} \quad (14)$$

$$P_{R1} = |I_1|^2 R_1 = \frac{N_1^4 \left(\frac{\omega L_0}{R_1}\right)^2 \left(\frac{R_1}{R_L}\right)}{1 + \left(\frac{\omega L_0}{R_1}\right)^2 \left(N_1^2 + \frac{R_1}{R_L}\right)^2} \frac{E^2}{R_L} = \beta_1 \frac{E^2}{R_L} \quad (15)$$

In the case where the number of the secondary-side winding is n=2, followings can be acquired.

$$P_{RL} = |I_0|^2 R_L = \frac{1 + \left(\frac{\omega L_0}{R_1 R_2}\right)^2 (N_1^2 R_2 + N_2^2 R_1)^2}{1 + \left(\frac{\omega L_0}{R_1 R_2}\right)^2 \left(N_1^2 R_2 + N_2^2 R_1 + \frac{R_1 R_2}{R_L}\right)^2} \frac{E^2}{R_L} = \alpha_2 \frac{E^2}{R_L} \quad (16)$$

$$P_{R1} = |I_1|^2 R_1 = \frac{N_1^2 \left(\frac{\omega L_0}{R_1 R_2}\right)^2 \left(\frac{R_1}{R_L}\right) R_2^2}{1 - \left(\frac{\omega L_0}{R_1 R_2}\right)^2 \left(N_1^2 R_2 + N_1^2 R_1 + \frac{R_1 R_2}{R_L}\right)^2} \frac{E^1}{R_L} = \beta_1' \frac{E^2}{R_L} \quad (17)$$

$$P_{R2} = \frac{N_2^2 \left(\frac{\omega L_0}{R_1 R_2}\right)^2 \left(\frac{R_2}{R_L}\right) R_2^2}{1 + \left(\frac{\omega L_0}{R_1 R_2}\right)^2 \left(N_1^2 R_2 + N_2^2 R_1 + \frac{R_1 R_2}{R_L}\right)^2} \frac{E^2}{R_L} = \beta_2' \frac{E^2}{R_L} \quad (18)$$

In the case where the number of the secondary-side winding is n=3, followings can be acquired.

$$P_{RL} = |I_0|^2 R_L = \quad (19)$$

$$\frac{1 + \left(\frac{\omega L_0}{R_1 R_2 R_3}\right)^2 (N_1^2 R_2 R_3 + N_2^2 R_1 R_3 + N_3^2 R_1 R_2)^2}{1 + \left(\frac{\omega L_0}{R_1 R_2 R_3}\right)^2 \left(N_1^2 R_2 R_3 + N_2^2 R_1 R_3 + N_3^2 R_1 R_2 + \frac{R_1 R_2 R_3}{R_L}\right)^2} \frac{E^2}{R_L} =$$

$$\alpha_3 \frac{E^2}{R_L}$$

$$P_{R1} = |I_1|^2 R_1 = \quad (20)$$

$$\frac{N_1^2 \left(\frac{\omega L_0}{R_1 R_2 R_3}\right)^2 \left(\frac{R_1}{R_L}\right)(R_2 R_3)^2}{1 + \left(\frac{\omega L_0}{R_1 R_2 R_3}\right)^2 \left(N_1^2 R_2 R_3 + N_2^2 R_1 R_3 + N_3^2 R_1 R_2 + \frac{R_1 R_2 R_3}{R_L}\right)^2} \frac{E^2}{R_L} =$$

$$\beta_1'' \frac{E^2}{R_L}$$

$$P_{R2} = |I_2|^2 R_2 = \quad (21)$$

$$\frac{N_2^2 \left(\frac{\omega L_0}{R_1 R_2 R_3}\right) \left(\frac{R_2}{R_L}\right)(R_1 R_3)^2}{1 + \left(\frac{\omega L_0}{R_1 R_2 R_3}\right)^2 \left(N_1^2 R_2 R_3 + N_2^2 R_1 R_3 N_3^2 + \frac{R_1 R_2 R_3}{R_L}\right)^2} \frac{E^2}{R_L} = \beta_2'' \frac{E^2}{R_L}$$

-continued
$$P_{R3} = |I_3|^2 R_3 = \tag{22}$$

$$\frac{N_3^2 \left(\frac{\omega L_0}{R_1 R_2 R_3}\right)^2 \left(\frac{R_3}{R_L}\right)(R_1 R_2)^2}{1 + \left(\frac{\omega L_0}{R_1 R_2 R_3}\right)^2 \left(N_1^2 R_2 R_3 + N_2^2 R_1 R_3 + N_3^2 R_1 R_2 + \frac{R_1 R_2 R_3}{R_L}\right)^2} \cdot \frac{E^2}{R_L} =$$

$$\beta_3'' \frac{E^2}{R_L}$$

The same applies also for the case where the number of the secondary-side winding is n=n.

In Expressions (14) to (22), $E^2/R_L$ shows the noise power consumed in the equivalent noise load resistance $R_L$ when the noise reducer according to the present invention shown in FIG. 2 is not used, and α shows the reduction degree of the noise power consumed in the resistance $R_L$ when the noise reducer is used. Further, β shows the proportion of the noise power consumed in each of the resistances $Z_1, Z_2, ---, Z_n$ of the secondary-side windings $3_1, 3_2, ---, 3_n$ to $E^2/R_L$. In other words, β shows the contribution rate for the noise environment purification.

Therefore, due to the existence of the noise reducer according to the present invention shown in FIG. 2, the noise power $E^2/R_L$ consumed in the resistance $R_L$ when the noise reducer is not used is reduced as is evident from Expressions (14), (16), and (19). The reduced power is consumed in each of the resistances $Z_1, Z_2, ---, Z_n$ of the secondary-side windings $3_1, 3_2, ---, 3_n$ as is evident from Expressions (15), (17), (18), (20), (21), and (22).

Therefore, the power consumption of the noise in the noise load, i.e., the noise reduction effect, of the noise reducer according to the present invention is the same as the case of the single-winding circuit. However, the noise power consumption amount by the impedance element 4 connected to the winding 3 of the secondary-side winding circuit P is increased in the case where the secondary-side winding circuit P is formed with a plurality of winding circuits P than the case where it is formed with a single-winding circuit P. The more the number of the secondary-side winding circuits P is increased, the more the noise power consumption amount is increased. That is, the noise environment purifying function is increased.

Figure 4A:
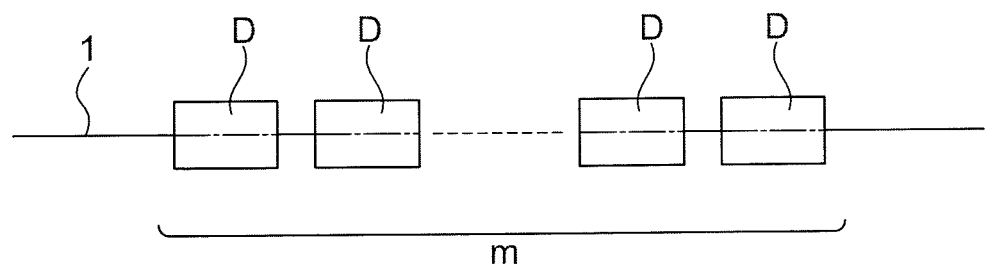

Next, a modification example of the embodiment according to the present invention shown in FIG. 2 will be described. In the embodiment according to the present invention shown in FIG. 2, shown is a mode where the conductor wire 1 of FIG. 1 is inserted into the hollow hole 2a of the cylindrical core 2 of a single noise reducer D. However, in a case where a priority is given to the noise failure reduction effect for the electronic device exposed to the electromagnetic noise interference by sacrificing the environmental electromagnetic noise reduction effect, the conductor wire 1 may be used by being inserted to the hollow hole 2a of the cylindrical core 2 of m (m=1 to n) pieces of noise reducer(s) D as shown in FIG. 4A. As the embodiment of such case, the effect of the case where m=3 will be described.

First, the value of a shown in Expression (10) when the m-pieces are inserted comes in a form of $\alpha_m$ shown in Expression (26). For describing the process of deriving Expression (26), the impedance Z of the winding 3 side viewed from the conductor wire 1 side inserted into the hollow hole 2a of the cylindrical core 2 in FIG. 1B, i.e., the impedance of the secondary-side winding viewed from the primary side in the transformer, is shown by Expression (23).

$$Z = \frac{1}{1 + N^4 \left(\frac{\omega L_0}{R}\right)^2} \left\{ N^2 \left(\frac{\omega L_0}{R_1}\right)^2 R_1 + j\omega L_0 \right\} \tag{23}$$

Thus, the input impedance $Z_{in}$ viewed from the noise source E side when m-pieces of those are placed in series can be expressed by Expression (24).

$$Z_m = R_L + \frac{m}{1 + N^4 \left(\frac{\omega L_0}{R}\right)^2} \left\{ N^2 \left(\frac{\omega L_0}{R_1}\right)^2 R_1 + j\omega L_0 \right\} \frac{R_L}{1 + N^4 \left(\frac{\omega L_0}{R_1}\right)^2} \tag{24}$$

$$\left\{ 1 + N^4 \left(\frac{\omega L_0}{R_1}\right)^2 + mN^2 \left(\frac{\omega L_0}{R_1}\right)^2 \left(\frac{R_1}{R_L}\right) + jm\left(\frac{R_1}{R_L}\right)\left(\frac{\omega L_0}{R_1}\right) \right\}$$

Expression (25) can be acquired from Expression (24).

$$|Z_m| = \frac{R_L}{1 + N^4 \left(\frac{\omega L_0}{R}\right)^2} \left[ 1 + \left(\frac{\omega L_0}{R_1}\right)^2 \left\{ N^2 + m\left(\frac{R_1}{R_L}\right) \right\}^2 \right]^{1/2} \tag{25}$$

From $$|I_0| = \frac{E}{|Z_m|},$$

α similar to that of Expression (10) can be acquired in a form of Expression (26) by $P_{RL} = |I_0|^2 R_L$.

$$\alpha_m = \frac{1 + N^4 \left(\frac{\omega L_0}{R_1}\right)^2}{1 + \left(\frac{\omega L_0}{R_1}\right)^2 \left(N^2 + m\frac{R_1}{R_L}\right)^2} \tag{26}$$

$$\beta_m = \frac{mN^4 \left(\frac{\omega L_0}{R_1}\right)^2 \left(\frac{R_1}{R_L}\right)}{1 + \left(\frac{\omega L_0}{R_1}\right)^2 \left(N^2 + \frac{R_1}{R_L}\right)^2} \tag{27}$$

Similarly, regarding β, provided that $L_0$=64 μH, N=3, the pure resistance value $R_1$ of the resistance 4 connected to the winding 3 is 1 KΩ, and m=3 in Expression (26) and Expression (27), the value of $\alpha_m$ becomes −9 dB at the noise frequency of 100 kHz, −16.6 dB at the noise frequency of 500 kHz, and −17.7 dB at the noise frequency of 2 MHz or more. Thus, a better noise failure reduction effect can be achieved. However, the value of $\beta_m$ showing the noise power absorption effect by $R_1$ becomes 0.10 at the noise frequency of 100 kHz, 0.11 at the noise frequency of 500 kHz, and also 0.11 at the noise frequency of 2 MHz or more. Therefore, the electromagnetic environment purifying function is deteriorated than the case where m=1, i.e., the case of inserting single piece.

Further, the value of $\alpha_m$ when the pure resistance value $R_1$ of the resistance 4 connected to the winding 3 is set as 5 KΩ becomes −8.5 dB at the noise frequency of 100 kHz, −21.4 dB at the noise frequency of 500 kHz, −28.9 dB at the noise frequency of 2 MHz, and −30.7 dB at the noise frequency of 10 MHz or more. Thus, the noise power reduction effect for the electronic device side is increased. However, the value of $\beta_m$ becomes 0.02 at the noise frequency of 100 kHz, and also 0.03 at the noise frequency of 500 kHz or more. Thus, the electromagnetic environment purifying function is deteriorated greatly to only about 3%.

As described, it is shown that even when a plurality of noise reducer according to the present invention are used and the conductor wires 1 are inserted to the hollow holes 2a of the cylindrical cores 2 of the plurality of noise reducers to be used, the use number m, the coiled number N of the windings 3, the resistance value $R_1$ of the resistance 4 connected to the winding 3 may be determined as appropriate by calculations of the numerical values of Expression (26) and Expression (27) according to the state of the noise failure and the electromagnetic environment where the electronic device exposed to the interference is placed.

The interference by the electromagnetic noise occurs when the conductor wire 1 such as the earth line, the power supply line, or the like connected to the electronic device functions as an antenna. Thus, the mode of the noise current propagated on the conductor wire 1 is basically a common mode. However, the conductor wire 1 such as the power supply line is of a double-line type, and it is bent at an acute angle and drawn around. Therefore, it is converted to a normal (differential) mode noise current, so that noise currents of two modes coexist in the conductor wire 1.

In a case where the double-line type conductor wire 1 such as the power supply line is inserted and used in the noise reducer according to the embodiment of the present invention, it is considered theoretically that the noise failure reduction effect is exhibited only for the common-mode noise current that is the basic noise current, and that there is no noise failure reduction effect for the normal-mode current since the normal (differential) mode noise current flows on the two conductor wires 1 in the reverse directions from each other and cancels the magnetic flux formed within the cylindrical core 2.

Figure 4B:
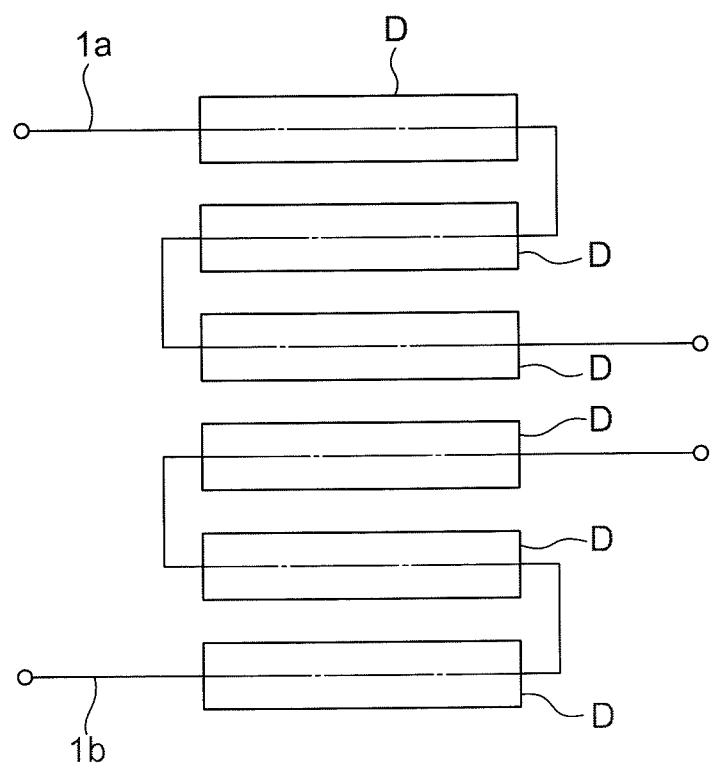
FIG. 4B is a case where those are employed for double-line type conductor wires such as conventional power-supply lines, for example.

Thus, in order to make the noise reducer according to the embodiment of the present invention effective simultaneously for the noise currents of the two modes, the structure shown in FIGS. 4A and 4B are proposed. However, in this case, each of the two conductor wires 1a and 1b is penetrated through the hollow hole 2a of the cylindrical core 2 of the noise reducer D of FIG. 1 according to the embodiment of the present invention as shown in FIG. 4B. Therefore, the magnetic flux by a large current of the power supply current and the like is generated inside the cylindrical core 2 according to the well-known "Ampere's circuital integral" law. However, the embodiment is a form which uses the conductor wire 1 by inserting it as described above. Thus, the embodiment corresponds to the case where the number of the primary winding of the transformer is "1", and it is a use form as the inductor where the magnetic saturation is suppressed in the best manner. Further, it is considered that the reducer that can bear a large current value of a power supply current or the like can be achieved without having a magnetic saturation by the use of the cylindrical core 2 with a large core diameter.

Further, in the structure shown in FIG. 4B, a plurality of noise reducers D are used to deal with the both noise currents of the normal (differential) mode. In this case, the coiled number N of the windings 3 and each resistance value $R_1$ of the resistances 4 in each of the noise reducers D may vary from each other.

Figure 5:
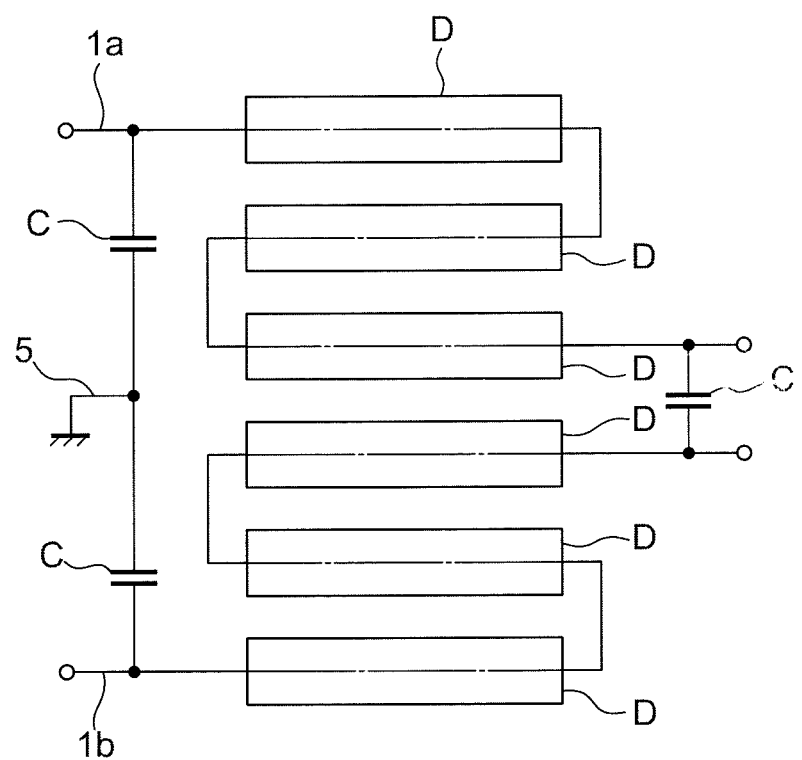
FIG. 5 is a circuit diagram showing an embodiment of a power-supply line noise filter in which the noise reducer according to the present invention and a capacitor are used in combination.

Further, as shown in FIG. 5, it is also possible to use a conventional noise filter technique, and parallel capacitors C may be additionally used at input/output terminals of the conductor wires 1a and 1b penetrated through the noise reducers D.

As described above, with the embodiment of the present invention, it is possible to reduce the electromagnetic noise interference by inserting the conductor wire such as the earth line or the power line to the cylindrical core of the noise reducer, to reduce the reflection of the electromagnetic noise (i.e., reactive power), and to purify the electromagnetic noise environment.

Further, since the conductor wire can be placed by being inserted into the cylindrical core of the noise reducer, the interference caused due to the noise currents superimposed on a plurality of earth lines and power supply lines can be reduced effectively even when the conductor wire 1 is a single earth line or double or triple power supply lines. Furthermore, the wiring connection work of the conductor wires become unnecessary in many cases by using the conductor wire through inserting it into the cylindrical core of the noise reducer, so that it is highly convenient.

Next, a modification example of the embodiment of the present invention will be described. The modification example uses magnetic core materials of different magnetic permeability values for the magnetic ring cores $2_1, 2_2, ---, 2_n$ such as the ferrite for forming the cylindrical core 2 shown in FIG. 1, and forms the cylindrical core 2 shown in FIG. 1 by stacking a plurality of magnetic ring cores $2_1, 2_2, ---, 2_n$ of different magnetic permeability values. The other structures including the winding 3 and the impedance element 4 are the same as those shown in FIGS. 1A and 1B.

As the cylindrical core 2 shown in FIG. 1, described is the case where a plurality of magnetic ring cores (e.g., toroidal cores) $2_1, 2_2, 2_3, ---, 2_n$ of equivalent magnetic permeability values are stacked. However, the cylindrical core 2 may also be formed by stacking a plurality of magnetic ring cores $2_1, 2_2, 2_3, ---, 2_n$ of different magnetic permeability values.

As the magnetic ring cores $2_1, 2_2, 2_3, ---, 2_n$ of different magnetic permeability values, magnetic core material such as ferrite or amorphous is used. The noise damping function of the noise reducer constituted by staking a plurality of such magnetic ring cores $2_1, 2_2, 2_3, ---, 2_n$ of different magnetic permeability values depends on the magnetic permeability ($\mu=\mu'-j\mu''$) of each of the magnetic ring cores. Each of ($\mu'$) and ($\mu''$) changes depending on the frequency of the current. Further, as is well known, ($\mu'$) is a constant of proportionality of the magnetic flux formed within the magnetic ring core by the magnetic field that depends on the current, and ($\mu''$) is a constant of proportionality of the consumption power generated within the magnetic ring core by the magnetic field. That is, the self-inductance $L_0$ of the magnetic ring core is given by a following expression.

$$L_0 = \frac{\mu N^2 A}{2\pi \rho} \tag{28}$$

In Expression (28), N is the number of turns coiled to the magnetic ring core (e.g., toroidal cores $2_1, 2_2, ---, 2_n$), A is the sectional area of the magnetic ring core (e.g., toroidal cores $2_1, 2_2, ---, 2_n$), and $\rho$ is the average magnetic path length of the magnetic ring cores (e.g., toroidal cores $2_1, 2_2, ---, 2_n$).

In this case, $\mu$ in Expression (28) is the real part of permeability value. Thus, precisely, $\mu$ on the left side is supposed to be written as ($\mu'$). However, in general, it is allowed to consider ($\mu''$) that shows the magnetic loss as 0. Therefore, it is simply expressed as (Literature: DOVER PUBLICATION, INC. Minecola, N.Y., "Roger F, Harrington", "Electromagnetic Engineering" pp 245).

Therefore, µ regarding $L_1 \approx N^2 L_0$ shown in (1) of the noise reducer is (µ'), and the value thereof exhibits the frequency characteristic.

Figure 6:
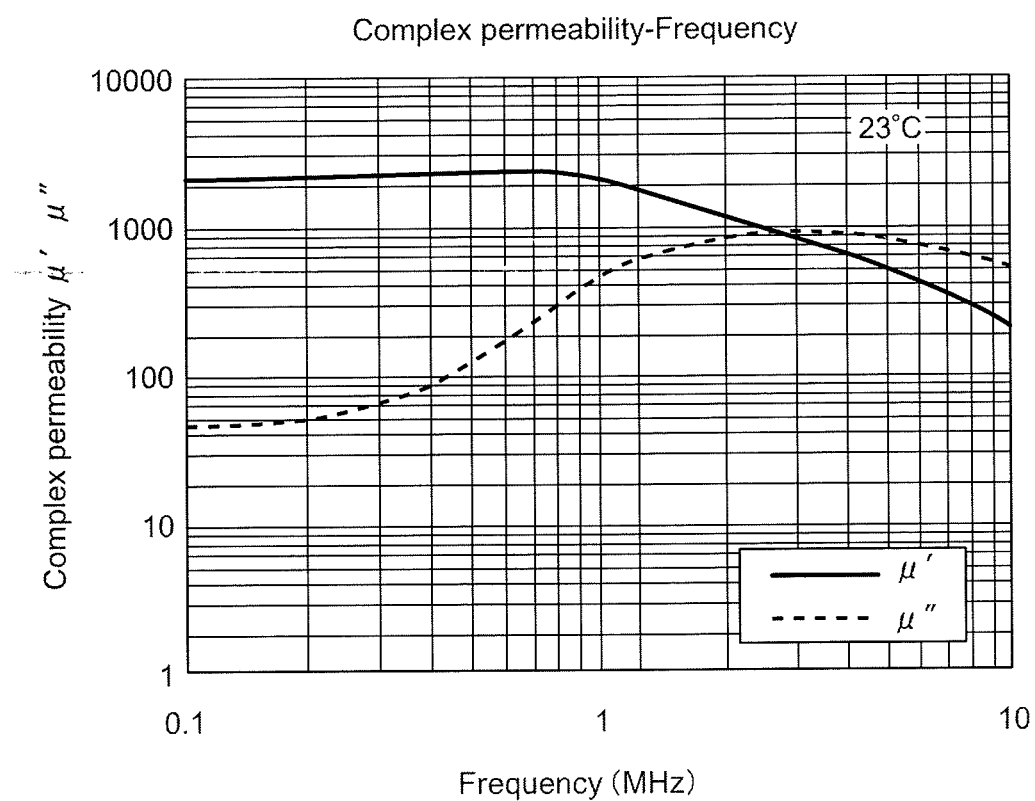
FIG. 6 is a characteristic chart showing the magnetic permeability frequency characteristic of a magnetic core material.
Figure 7:
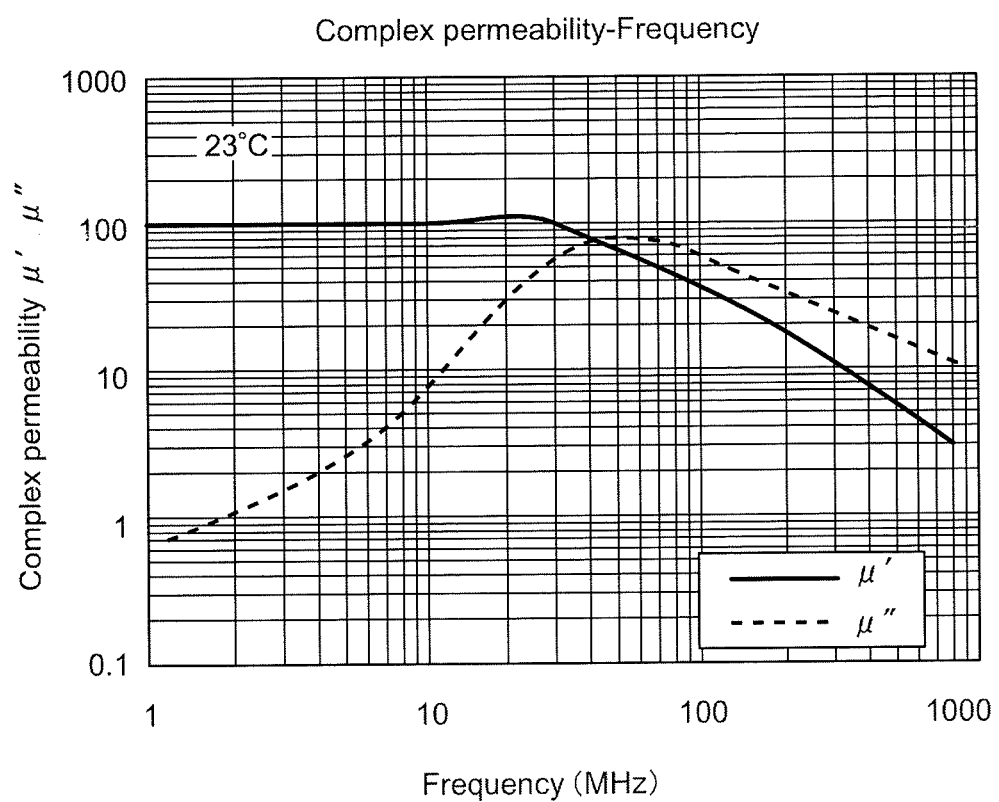
FIG. 7 is a characteristic chart showing the magnetic permeability frequency characteristic of a magnetic core material.

As the magnetic ring cores (e.g., toroidal cores $2_1$, $2_2$, ---, $2_n$), those having various frequencies for (µ') and (µ") such as Ni—Zn, Mn—Zn-based ferrite, amorphous, and the like are available on the market. For example, there are the type which has a low (µ') value but exhibits the inductor characteristic until the frequency characteristic of 100 MHz or more as shown in FIG. 6, and the type which has a high (µ') value and exhibits the inductor characteristic only to the frequency characteristic of several tens of MHz as shown in FIG. 7.

The noise reducer according to the embodiment of the present invention is designed to achieve the object of reducing/eliminating the noise failure by absorbing the noise power with the resistance (impedance element) 4 of the secondary-side winding circuit P through utilizing the inductor function of the magnetic ring cores (e.g., toroidal cores $2_1$, $2_2$, ---, $2_n$). Thus, it is desirable for the magnetic ring core members $2_1$ to $2_n$ shown in FIG. 1 to exhibit the noise reduction effect over the wide range by mixing those having the various frequency characteristics described above as the (µ') value.

Note that (µ") is a constant of proportionality of the energy of the magnetic field derived by the current, which is consumed within the magnetic ring core member such as the ferrite, so that it does not depend on the effect of the winding 3 of the noise reducer shown in FIG. 1. That is, it is the constant showing the noise power consumption effect which depends only on the material of the magnetic ring core members $2_1$ to $2_n$.

Figure 13:
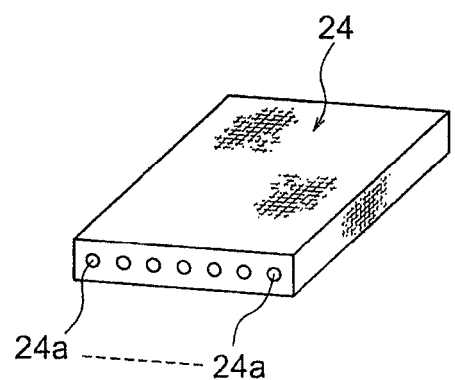
FIG. 13 is a perspective view showing a widely-used bead-type ferrite noise countermeasure product on the market in which the bead type is formed as a multiple-line type.

Therefore, in the noise reducer according to the embodiment of the present invention, it is desirable for the value of (µ") within the low-frequency band such as a commercial power frequency or the like to be equal to 0, and it is desirable to employ the magnetic ring cores which exhibit a large value in the noise frequency band. Further, in general, there are many ferrite or amorphous magnetic substances that have such characteristic that the value in the real part (µ') of the magnetic permeability rapidly decreases in the MHz band and value in the imaginary part (µ") increases. However, such characteristic is the same function as that of the noise countermeasure product of the conventional ferrite bead shown in FIG. 12 and FIG. 13, and it can be applied to the present invention.

Figure 8:
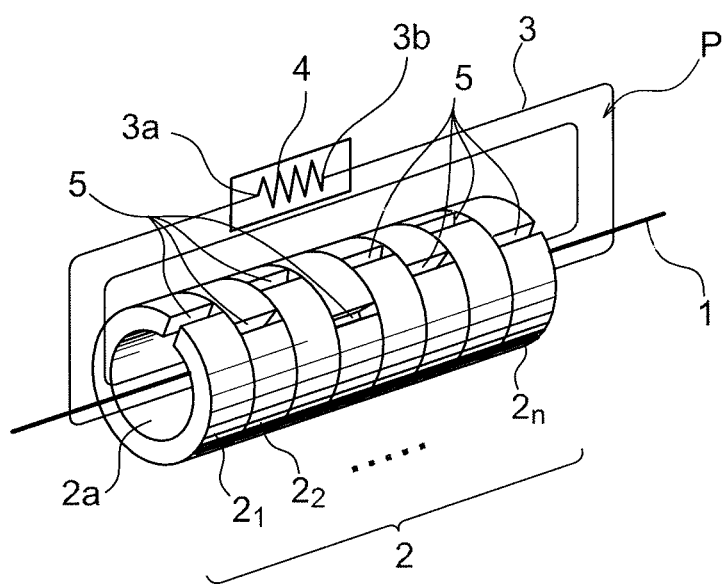
FIG. 8 is a perspective view showing the noise reducer according to the embodiment of the present invention, which uses cores with air gaps for adjusting inductance of the inductor and the saturated current value of the cylindrical cores with the air gaps.
Figure 10:
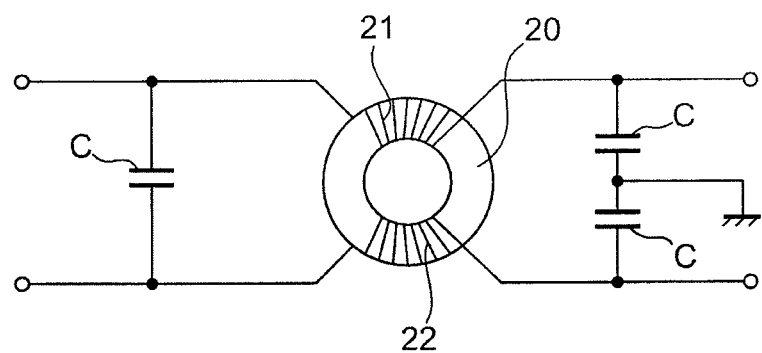
FIG. 10 is an illustration showing a circuit block diagram of a widely-used power-supply line noise filter.
Figure 11:
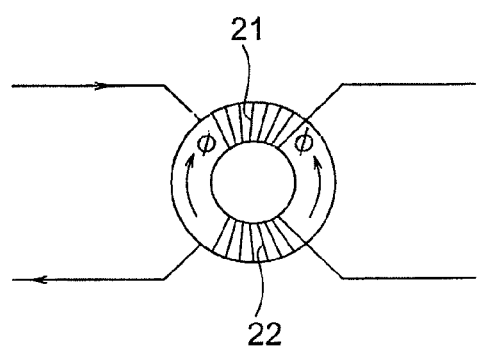
FIG. 11 is an explanatory illustration showing an inductor inner magnetic field of the widely-used power-supply line noise filter.

Further, another modification example of the embodiment of the present invention will be described. As shown in FIG. 8, this another modification example employs a structure in which air gaps 5 are provided in all of (or a part of) the magnetic ring cores $2_1$, $2_2$, ---, $2_n$ that form the cylindrical core 2 shown in FIG. 1, and the positions of the air gaps 5 of the magnetic ring cores $2_1$, $2_2$, ---, $2_n$ are relatively shifted from each other in the circumferential direction of the ring core. The other structures including the winding 3 and the impedance element 4 are the same as those shown in FIGS. 1A and 1B.

There is a widely used technique which increases the magnetic resistance through providing the air gap, a narrow slot cut 5 in the magnetic ring cores $2_1$, $2_2$ such as ferrite or amorphous so as to increase the magnetic saturation current compared to the case without the air gap 5. In that case, it is a well-known fact that the magnetic resistance value of the magnetic ring cores $2_1$, $2_2$, ---, $2_n$ change depending on the width of the air gap 5 and that the effective (µ') value is decreased greatly compared to the case without the air gap 5.

As can be seen from Expressions (1), (10), and (11) described above, in the noise reducer according to the embodiment of the present invention, a decrease in the (µ') value leads to a decrease in the inductance $L_0$ of the conductor wire 1 inserted into the hollow hole 2a of the cylindrical core 2, which results in deterioration of the noise damping effect.

However, existence of the air gaps 5 can ease the magnetic saturation of the magnetic ring cores $2_1$, $2_2$ by the signal (power supply or the like) current as described above, i.e., can extend the magnetic saturation phenomenon to a greater use current value. Thus, in order to eliminate the noise current superimposed on a large current such as a power supply current, it is essential to employ the magnetic ring cores having the air gap 5.

However, it is extremely difficult in the noise reducer to keep the state of a decrease in the value of the inductance $L_0$ of the conductor wire 1 inserted into the hollow hole 2a of the cylindrical core 2 and the signal current value of the power supply current, for example, to be optimum. That is, it is not impossible but extremely difficult to set the length of the air gap 5 as the limit with which the magnetic ring cores $2_1$, $2_2$, ---, $2_n$ are not magnetically saturated by the signal current value and to keep the value of the inductance $L_0$ of the conductor wire 1 inserted into the hollow hole 2a of the cylindrical core 2 as the largest value as much as possible.

Thus, as shown in FIG. 8, the end faces of the neighboring magnetic ring cores $2_1$, $2_2$, ---, $2_n$ are abutted against each other and the positions of the air gaps 5 provided in the magnetic ring cores $2_1$, $2_2$, ---, $2_n$ are relatively shifted from each other in the circumferential direction of the ring cores $2_1$, $2_2$, ---, $2_n$ to arrange the positions of the air gaps 5 of the magnetic ring cores $2_1$, $2_2$, ---, $2_n$ relatively shifted from each other.

As described, through arranging the positions of the air gaps 5 of the magnetic ring cores $2_1$, $2_2$, ---, $2_n$ relatively shifted from each other, a leakage magnetic flux in the air gap 5 of one of the neighboring magnetic ring cores is coupled again within the other one of the neighboring magnetic ring cores by the air gap 5 of the other one of the neighboring magnetic ring cores or by the end face where there is no air gap 5. Accordingly, effective magnetic permeability of the magnetic ring core is reduced by the air gaps 5. As a result, magnetic saturation of the magnetic ring cores $2_1$, $2_2$, ---, $2_n$ by the current flown in the winding 3 and the inductance by the winding 3 and the magnetic ring cores $2_1$, $2_2$, ---, $2_n$ can be set to the optimum values. As described, it is possible to suppress the magnetic saturation generated in the cylindrical core 2 by the signal current of the power supply current or the like to the minimum, and to increase the multiplicity of use by corresponding to a large signal current.

As an experimental example, there is described a case where the inductance value is measured when the positions of the air gap 5 of the two neighboring magnetic ring cores $2_1$, $2_2$ are shifted relatively in the circumferential direction of the magnetic ring cores $2_1$, $2_2$.

As shown in FIG. 8, the winding 3 of fifty turns is coiled around the two magnetic ring cores $2_1$, $2_2$ neighboring to each other stacked in two stages with the air gaps 5, 5, and the positions of the air gap 5 of the magnetic ring core $2_1$ or $2_2$ is shifted by θ degrees with respect to the position of the air gap 5 of the other magnetic ring core $2_2$ or $2_1$. FIG. 9 shows the result of measuring the impedance value of such case measured by an impedance meter.

In FIG. 9, regarding θ (degrees) showing the positions of the two air gaps 5 and the inductance value L ($L_0$) given by the winding 3, the upper row shows the shift angle θ of the air gaps 5, while the lower row shows the inductance value L ($L_0$) mH given by the winding 3.

Further, there is no problem to consider the impedance Z of such case as a pure reactance, so that L (mH) as the inductance value for the change of θ can be acquired provided that z=jX=jω$L_1$ and $L_1$=X/ω.

In the experiment, ferrite cores which have relative permeability, were used as the ring cores $2_1$, $2_2$, the size of the two magnetic ring cores $2_1$, $2_2$ was 60 mm in the external diameter, 40 mm in the inside diameter, 18 mm in thickness, and the width of the air gaps 5 was 4 mm for the both. Further, separately from that, the inductance of a case where the winding 3 of fifty turns was coiled around the two magnetic ring cores of the same shape having no air gap 5 of 4 mm was measured by the impedance meter. As the measured value, a fixed value of 56 mH was acquired.

As evident from the experimental example, it is confirmed that, because the positional relation of the air gaps 5 of the magnetic cores $2_1$, $2_2$ is shifted in the circumferential direction, each of the leakage magnetic flux by the air gaps 5 is coupled again within the other one of the magnetic ring cores $2_2$, $2_1$ by the air gaps 5 of the other one of the magnetic ring core $2_1$ or $2_2$ or by the end face where there is no air gap 5. Accordingly, effective magnetic permeability of the magnetic ring core is reduced by the air gaps 5. As a result, it is confirmed that there is an effect of being able to set the magnetic saturation of the magnetic ring cores by the current and the inductance value to the optimum values.

While single turn of the winding 3 is shown in FIG. 1 and FIG. 8 which show the embodiment of the present invention, the winding 3 may be coiled for a plurality of turns.

INDUSTRIAL APPLICABILITY

The present invention is capable of reducing the noise failure in the medical equipment and computer-controlled electronic precision devices while contributing to purification of the noise electromagnetic environment.

REFERENCE NUMERALS

1 Conductor wire
2 Cylindrical core
3 Winding
4 Resistance
5 Air gap

The invention claimed is:

1. A noise reducer for reducing electromagnetic noise interference generated in an electronic device by a noise current superimposed on a conductor wire, the noise reducer comprising:
    a cylindrical magnetic core including the conductive wire penetrated through a hollow hole;
    a winding coiled via the hollow hole of the cylindrical magnetic core; and
    an impedance element connected to the winding,
    wherein an inductance $L_0$ if the conductor wire is inserted into the hollow hole of the cylindrical magnetic core an, inductance $L_1$ given by the winding coiled around the cylindrical magnetic core, and a coiled number N of the winding are in a relation of $L_1 \approx N^2 L_0$.

2. The noise reducer as claimed in claim 1,
    wherein a plurality of magnetic ring cores to which the winding is provided are used as the cylindrical magnetic core, and the conductor wire is penetrated through the plurality of magnetic ring cores.

3. The noise reducer as claimed in claim 1, further comprising:
    a plurality of secondary-side winding circuits that are formed with the winding.

4. The noise reducer as claimed in claim 1, wherein magnetic ring cores of different magnetic permeability values are used as the cylindrical magnetic core.

5. The noise reducer as claimed in claim 4,
    wherein air gaps are provided in a part of or all of the magnetic ring cores, and positions of the air gaps of the magnetic ring cores are arranged to be relatively shifted from each other.

* * * * *

UNITED STATES PATENT AND TRADEMARK OFFICE
CERTIFICATE OF CORRECTION

PATENT NO. : 9,171,661 B2
APPLICATION NO. : 13/642028
DATED : October 27, 2015
INVENTOR(S) : Takashige Terakawa It is certified that error appears in the above-identified patent and that said Letters Patent is hereby corrected as shown below:

Claims

In column 20, line 18 (claim 1, line 10), the expression "if the" should read -- of the --.

In column 20, line 19 (claim 1, line 11), the expression "core an," should read -- core, an --.

Signed and Sealed this
Fifth Day of July, 2016

Michelle K. Lee
*Director of the United States Patent and Trademark Office*